(12) United States Patent
Lee

(10) Patent No.: US 9,504,145 B2
(45) Date of Patent: Nov. 22, 2016

(54) FLEXIBLE DISPLAY DEVICE

(71) Applicant: Samsung Display Co., Ltd., Yongin (KR)

(72) Inventor: Ja Eun Lee, Gyeongsan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 223 days.

(21) Appl. No.: 14/283,953

(22) Filed: May 21, 2014

(65) Prior Publication Data

US 2015/0131238 A1    May 14, 2015

(30) Foreign Application Priority Data

Nov. 14, 2013    (KR) .......................... 10-2013-0138293

(51) Int. Cl.
*H05K 1/00* (2006.01)
*H05K 1/02* (2006.01)
(Continued)

(52) U.S. Cl.
CPC .............. *H05K 1/028* (2013.01); *G09G 3/001* (2013.01); *G09G 2380/02* (2013.01); *H05K 1/0262* (2013.01); *H05K 1/0393* (2013.01);
(Continued)

(58) Field of Classification Search
CPC . G02F 1/13306; G02F 1/1303; H05K 3/281; H01L 2924/01078; H01L 2924/0002; H01L 41/193; H01L 41/0986; H01L 2924/00; H01L 41/083; H01L 41/293; H01L 41/0474; H01L 23/49827; H01L 23/5389; H01L 29/84; H01L 41/042; H01L 41/0833; H01L 41/094; H01L 41/098; H01L 51/0055; H01L 51/054

USPC ................... 349/58, 139–143, 147; 353/119; 361/679.01–679.02, 679.21, 679.26, 361/679.27, 679.28, 748–751, 755, 780
See application file for complete search history.

(56) References Cited

U.S. PATENT DOCUMENTS

2006/0274036 A1*  12/2006  Hioki .................... G06F 3/0412
345/156
2007/0279315 A1   12/2007  Laves et al.
(Continued)

FOREIGN PATENT DOCUMENTS

| JP | 2006-171735 | 6/2006 |
|---|---|---|
| KR | 10-2010-0123755 | 11/2010 |
| KR | 10-2011-0122244 | 11/2011 |

OTHER PUBLICATIONS

Koo, Ig Mo, et al., "Wearable Tactile Display Based on Soft Actuator," Robotics and Automation, ICRA, Proceedings 2006 IEEE International Conference, pp. 89-101, May 15-19, 2006.
(Continued)

*Primary Examiner* — Jeremy C Norris
*Assistant Examiner* — Roseline Alicea Rivera
(74) *Attorney, Agent, or Firm* — H.C. Park & Associates, PLC

(57) ABSTRACT

A flexible display device includes: a flexible display panel configured to display an image; a dielectric elastomer film disposed on a portion of the flexible display panel; a first electrode layer disposed on an upper portion of the dielectric elastomer film; and a second electrode layer disposed on a lower portion of the dielectric elastomer film, the first electrode layer includes a plurality of first electrodes, each of the plurality of first electrodes disposed apart from each other, the second electrode layer includes a plurality of second electrodes, each of the plurality of second electrodes disposed apart from each other.

14 Claims, 9 Drawing Sheets

(51) Int. Cl.
*G09G 3/00* (2006.01)
*H05K 1/03* (2006.01)

(52) U.S. Cl.
CPC . *H05K2201/015* (2013.01); *H05K 2201/0133* (2013.01); *H05K 2201/0162* (2013.01); *H05K 2201/026* (2013.01); *H05K 2201/0323* (2013.01); *H05K 2201/0329* (2013.01); *H05K 2201/057* (2013.01); *H05K 2201/10128* (2013.01)

(56) References Cited

U.S. PATENT DOCUMENTS

| | | |
|---|---|---|
| 2010/0002402 A1 | 1/2010 | Rogers et al. |
| 2012/0144743 A1 | 6/2012 | Piney |
| 2012/0154999 A1 | 6/2012 | Park |
| 2012/0324616 A1 | 12/2012 | Hyde et al. |
| 2013/0069859 A1 | 3/2013 | Säilä et al. |
| 2014/0098310 A1* | 4/2014 | Lee ............... G02F 1/133707 349/33 |
| 2014/0118639 A1* | 5/2014 | Matsushima ....... G02F 1/13338 349/12 |

OTHER PUBLICATIONS

Kim, Uikyum, et al., "A transparent and stretchable grephene-based actuator for tactile display," Nanotechnology, vol. 24, 145501, Apr. 12, 2013, pp. 1-7, IOP Publishing Ltd. (http://iopscience.iop.org/0957-4484/24/14/145501).

* cited by examiner

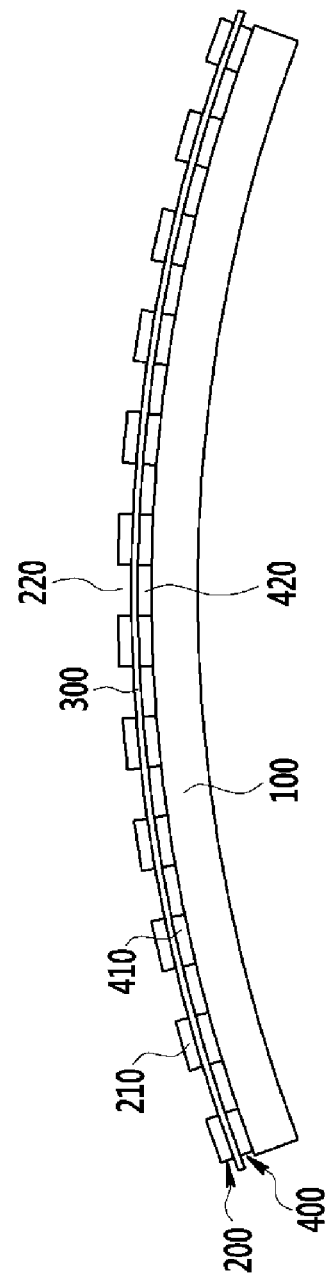

FLEXIBLE DISPLAY DEVICE

CROSS REFERENCE TO RELATED APPLICATION

This application claims priority from and the benefit of Korean Patent Application No. 10-2013-0138293, filed on Nov. 14, 2013, which is hereby incorporated by reference for all purposes as if fully set forth herein.

BACKGROUND

Field

Exemplary embodiments of the present invention relate to a flexible display device.

Discussion of the Background

A display device is a device which displays an image and recently, a flexible display device is drawing attention. A flexible display device is a display device that may be bent to create a curved surface or rolled to be easily portable and stored.

In order to bend the flexible display device, a user typically directly applies a force by his/her hand to bend or roll the flexible display device in a manner so that he/she may easily transport the flexible display device.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a flexible display that may bend without using a hand.

Additional features of the invention will be set forth in the description which follows, and in part will be apparent from the description, or may be learned by practice of the invention.

An exemplary embodiment of the present invention provides a flexible display device, comprising: a flexible display panel configured to display an image; a dielectric elastomer film disposed on a portion of the flexible display panel; a first electrode layer disposed on an upper portion of the dielectric elastomer film; and a second electrode layer disposed on a lower portion of the dielectric elastomer film, the first electrode layer comprises a plurality of first electrodes, each of the plurality of first electrodes disposed apart from each other, the second electrode layer comprises a plurality of second electrodes, each of the plurality of second electrodes disposed apart from each other.

As described above, according to the exemplary embodiments of the present invention, the first electrode layer, the dielectric elastomer film, and the second electrode are disposed on the upper portion or the lower portion of the flexible display panel, a voltage is applied to the first electrode forming the first electrode layer and the second electrode forming the second electrode layer, thereby bending the flexible display device without using a hand.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 9 is a diagram illustrating a case in which a voltage is applied to both the first electrode and the second electrode in the flexible display device illustrated in FIG. 7.

DETAILED DESCRIPTION OF THE ILLUSTRATED EMBODIMENTS

Figure 1:
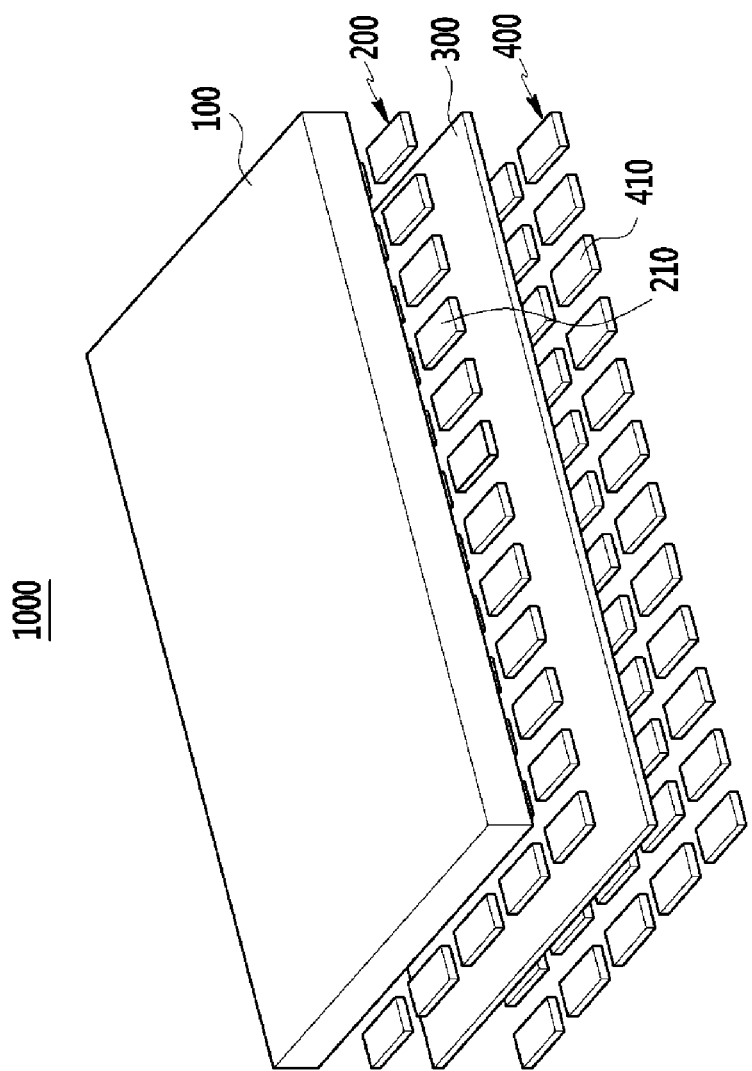
FIG. 1 is a perspective view schematically illustrating a flexible display device according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. In the drawings, the size and relative sizes of layers and regions may be exaggerated for clarity. Like reference numerals designate like elements throughout the specification. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
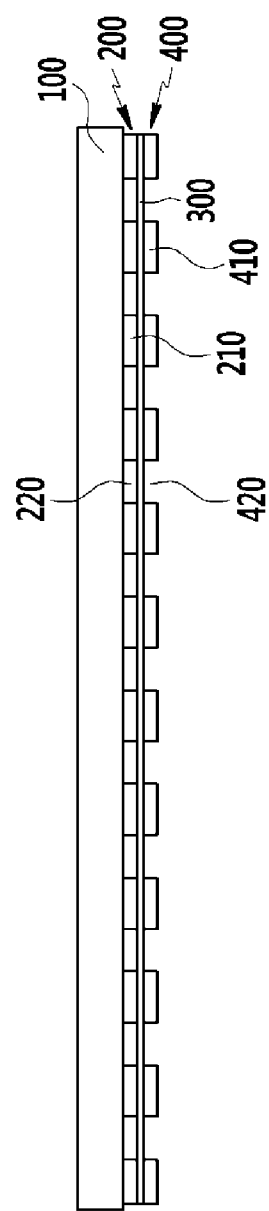
FIG. 2 is a diagram illustrating a side of the flexible display device illustrated in FIG. 1.
Figure 3:
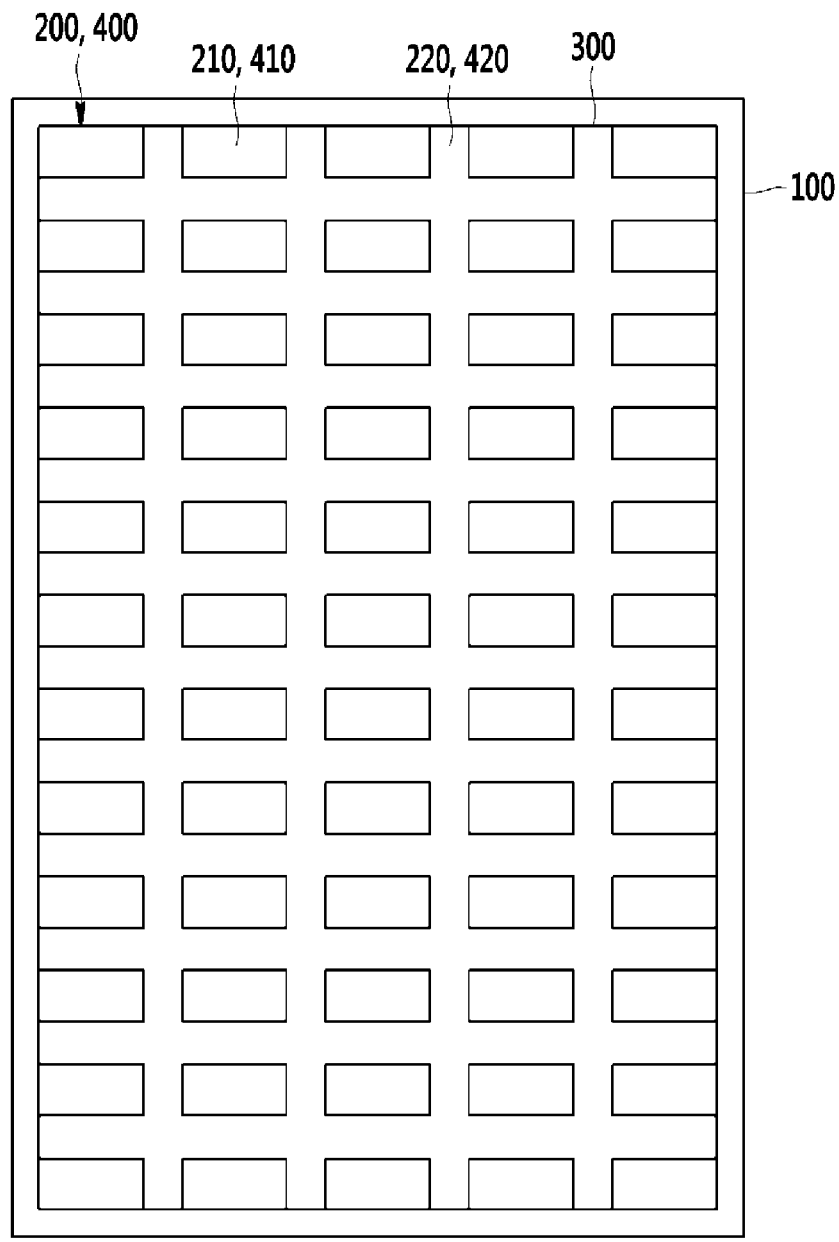
FIG. 3 is a diagram illustrating a rear of the flexible display device illustrated in FIG. 1.

FIG. 1 is a perspective view schematically illustrating a flexible display device according to an exemplary embodiment of the present invention, FIG. 2 is a diagram illustrating a side of the flexible display device illustrated in FIG. 1, and FIG. 3 is a diagram illustrating a rear of the flexible display device illustrated in FIG. 1.

Referring to FIGS. 1 to 3, a flexible display device 1000 according to an exemplary embodiment of the present invention includes a flexible display panel 100 which displays an image, a first electrode layer 200 which is disposed on a lower portion of the flexible display panel 100, a dielectric elastomer film 300, and a second electrode layer 400.

The flexible display panel 100 displays an image which is processed by the flexible display device 1000. For example, when the flexible display device 1000 is a mobile terminal such as a mobile phone, the flexible display device 1000 may display an image such as a user interface (UI) or a graphic user interface (GUI), which may be associated with a call.

The flexible display panel 100 includes a flexible substrate which is made of a plastic material having excellent heat resistance and durability, such as polyethylene naphthalate (PEN), polycarbonate (PC), polyarylate (PAR), polyether imide (PEI), polyether sulfone (PES), and/or polyimide (PI). Further, the exemplary embodiment of the present invention is not limited thereto, and the flexible display panel 100 may include a flexible substrate made of various materials having flexibility.

The flexible display panel 100 may be implemented using various display technologies. In one exemplary embodiment, the flexible display panel 100 may include a flexible substrate on which a plurality of thin film transistors, gate lines, data lines, and pixel electrodes are disposed, a flexible substrate on which a color filter and a common electrode are disposed, and a liquid crystal layer interposed between the two substrates.

In another exemplary embodiment, the flexible display panel 100 may include the plurality of thin film transistors, the gate lines, the data lines, and organic light emitting diodes, which are disposed on the flexible substrate.

A touch sensor or a touch panel in the form of a touch film, a touch sheet, and a touch pad, and the like, and senses a touch operation may be disposed on the upper portion of the flexible display panel 100. Herein, when the touch panel is disposed, the touch panel may also include the flexible substrate.

A dielectric elastomer film 300 is made of dielectric elastomer. The dielectric elastomer is a material having characteristics in which a thickness is reduced and an area is increased when being applied with a voltage. Herein, the dielectric elastomer may be a non-compressible material and may include, for example, at least one of silicon, fluoro elastic polymer, and isoprene.

The first electrode layer 200 is disposed on an upper portion of the dielectric elastomer film 300 and the second electrode layer 400 is disposed on a lower portion of the dielectric elastomer film 300. The first electrode layer 200 is disposed between the flexible display panel 100 and the dielectric elastomer film 300.

The first electrode layer 200 includes a plurality of first electrodes 210 and the second electrode layer 400 includes a plurality of second electrodes 410.

The first electrode 210 and the second electrode 410 may include at least one of carbon nanotubes, aluminum (Al), and molybdenum (Mo). Further, the first electrode 210 and the second electrode 410 may include at least one of graphite and conductive polymer, such that the electrodes may be flexible.

Referring to FIGS. 2 and 3, the plurality of first electrodes 210 are disposed to be spaced apart from each other as much as a first interval 220 and the plurality of second electrodes 410 are disposed to be spaced apart from each other as much as a second interval 420. The first electrode 210 and the second electrode 410 are disposed to overlap each other, having the dielectric elastomer film 300 therebetween. The first electrode 210 and the second electrode 410 are disposed on the lower portion of the flexible display panel 100 in a matrix form. For example, according to the exemplary embodiment of the present invention, the first electrode 210 and the second electrode 410 are disposed in a 5×12 form. However, the exemplary embodiment of the present invention is not limited thereto, but the first electrode 210 and the second electrode 410 may be disposed in various forms. Additionally, although the first electrode 210 and second electrode 410 are shown as being rectangular, the electrodes may have various shapes, such as square, circular, rhombus, or ovoid.

Herein, when the first electrode 210 and the second electrode 410 are applied with a voltage, an area of the dielectric elastomer film 300 may increase. In this case, the dielectric elastomer film 300 is tensioned and the tension bends the flexible display panel 100. That is, the flexible display panel 100 may be bent without using a hand.

Next, the bending of the flexible display device according to the exemplary embodiment of the present invention will be described in detail with reference to FIGS. 4 to 6.

Figure 4:
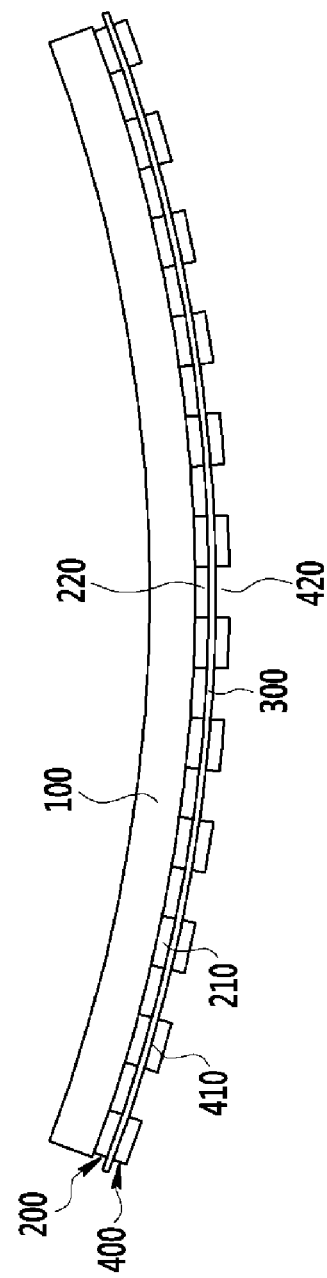
FIG. 4 is a diagram illustrating a case in which a voltage is applied to all the first electrodes and the second electrodes in the flexible display device illustrated in FIG. 1.

FIG. 4 is a diagram illustrating a case in which a voltage is applied to all the first electrodes and the second electrodes in the flexible display device illustrated in FIG. 1.

Referring to FIG. 4, the flexible display device according to the exemplary embodiment of the present invention is bent overall. FIG. 4 illustrates the case in which all the first electrodes 210 forming the first electrode layer 200 and all the second electrodes 410 forming the second electrode layer 400 are applied with a voltage.

When all the first electrodes 210 and all the second electrodes 410 are applied with a voltage, the dielectric elastomer film 300 between the first electrode 210 and the second electrode 410 is tensioned, such that the flexible display panel 100 is bent overall.

Herein, since the first electrode layer 200, the dielectric elastomer film 300, and the second electrode layer 400 are disposed on the lower portion of the flexible display panel 100, both ends of the flexible display panel 100 are bent toward the top from the bottom.

In this case, since the first electrode 210 and the second electrode 410 do not have an integrated plate but the plurality of first electrodes 210 are disposed to be spaced apart from each other as much as the first interval 220 and the plurality of second electrodes 410 are disposed to be spaced apart from each other as much as the second interval 420, when the flexible display panel 100 is bent, a lifting of the first electrode 210 and the second electrode 410 may be prevented.

Figure 5:
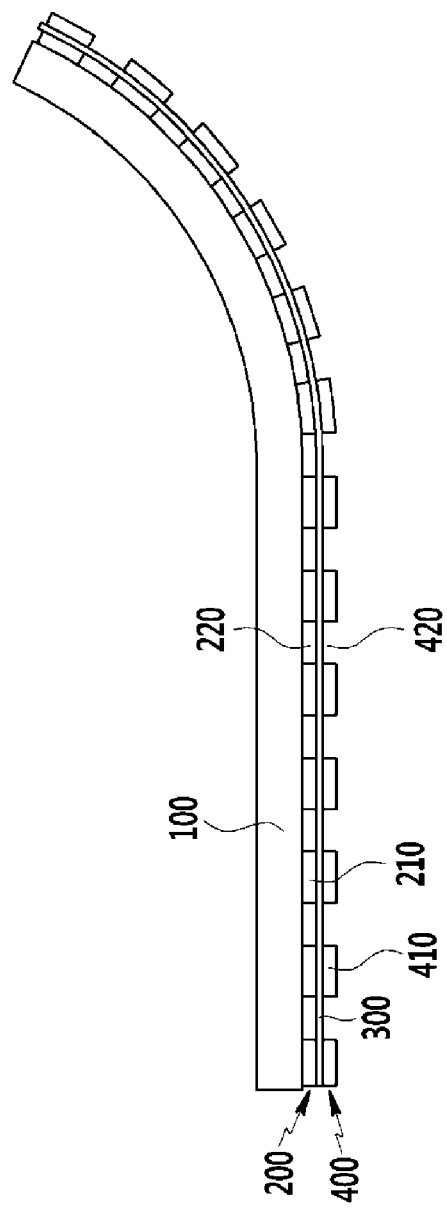
FIGS. 5 and 6 are diagrams illustrating a case in which a voltage is applied to some of the first electrodes and the second electrodes in the flexible display device illustrated in FIG. 1.
Figure 6:
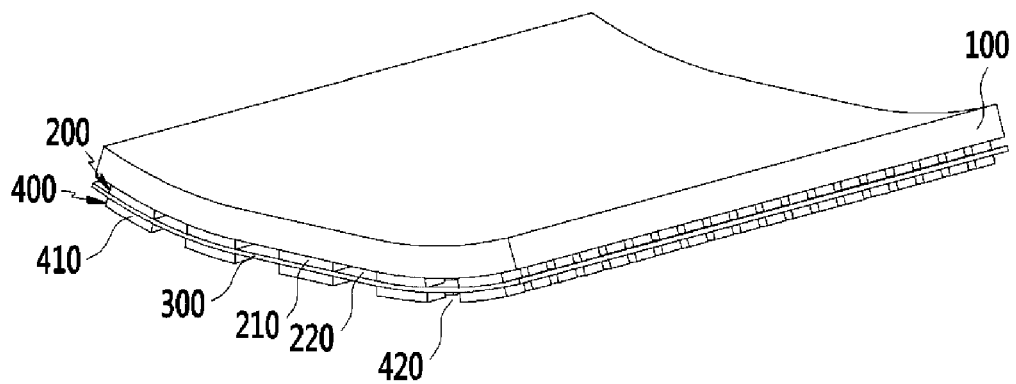

FIGS. 5 and 6 are diagrams illustrating a case in which a voltage is applied to some of the first electrodes and the second electrodes in the flexible display device illustrated in FIG. 1.

Referring to FIGS. 5 and 6, the flexible display device according to the exemplary embodiment of the present invention is partially bent. FIGS. 5 and 6 illustrate the case in which only some of the plurality of first electrodes 210 forming the first electrode layer 200 and only some of the plurality of second electrodes 410 forming the second electrode layer 400 are applied with a voltage.

FIG. 5 illustrates the case in which the plurality of first electrodes 210 disposed on the lower portion of the flexible display panel 100 and only the first electrode 210 and the second electrode 410 disposed at one end of the flexible display panel 100 among the plurality of second electrodes 410 are applied with a voltage. Therefore, only the dielectric elastomer film 300 disposed at one end of the flexible display panel 100 is tensioned and, thus, only one end of the flexible display panel 100 is bent toward the top from the bottom.

Further, when each electrode is applied with a voltage, in the case in which a voltage is sequentially applied from the first electrode 210 and the second electrode 410 disposed at one end of the flexible display panel 100 to the first electrode 210 and the second electrode 410 disposed at the other end of the flexible display panel 100, the flexible display panel 100 may be rolled from one end.

FIG. 6 illustrates the case in which the plurality of first electrodes 210 disposed on the lower portion of the flexible display panel 100 and only the first electrode 210 and the second electrode 410 disposed at both edges of the flexible display panel 100 among the plurality of second electrodes 410 are applied with a voltage. Therefore, only the dielectric elastomer film 300 disposed at both edges of the flexible display panel 100 is tensioned and, thus, only both edges of the flexible display panel 100 are bent toward the top from the bottom.

As described above, the first electrode layer 200, the dielectric elastomer film 300, and the second electrode 410 are disposed on the lower portion of the flexible display panel 100 and the first electrode 210 forming the first electrode layer 200 and the second electrode 410 forming the second electrode layer 400 are applied with a voltage, such that the flexible display device may be bent without using a hand.

Next, the flexible display device according to another exemplary embodiment of the present invention will be described with reference to FIGS. 7 to 9.

Figure 7:
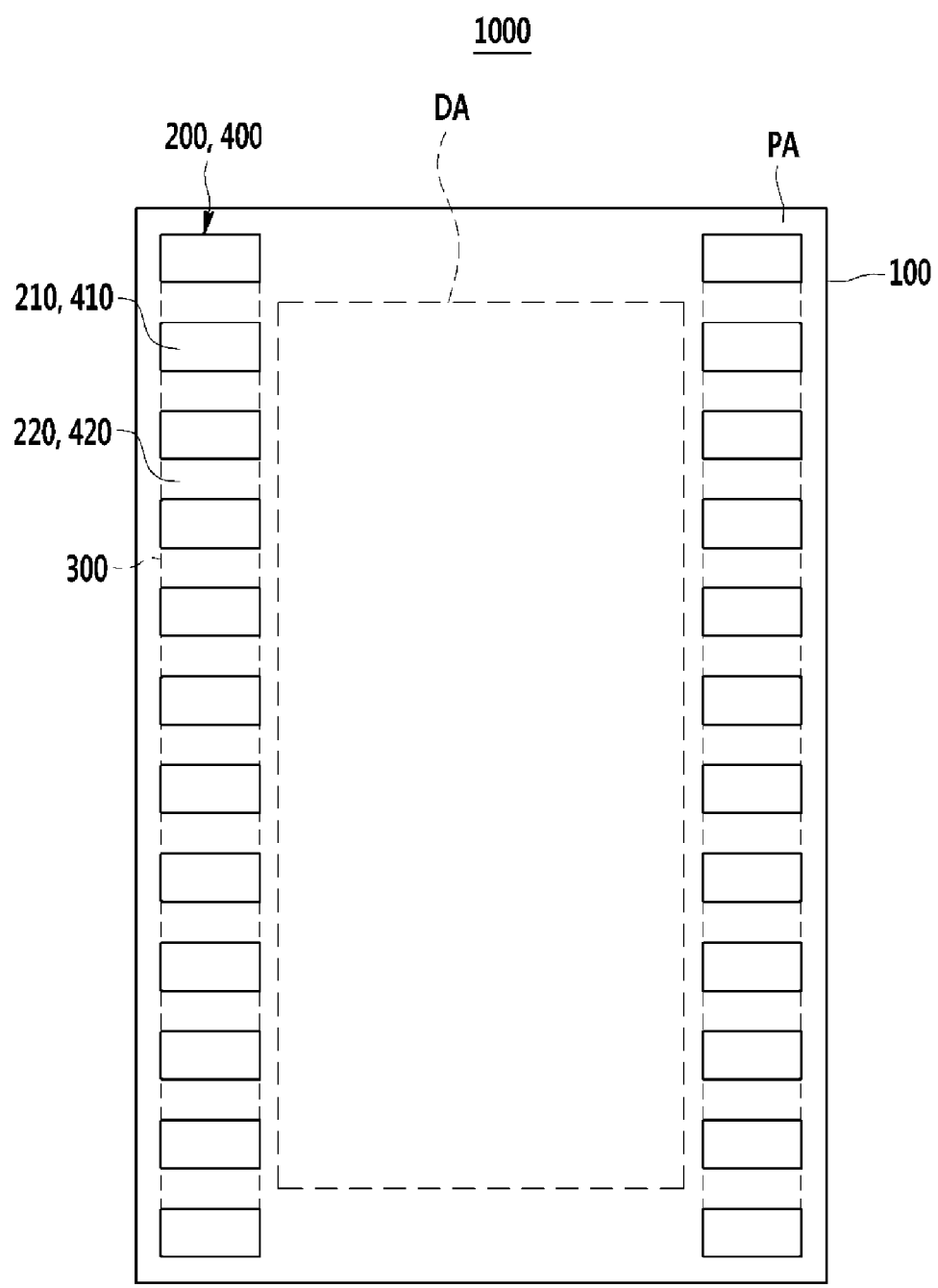
FIG. 7 is a diagram illustrating a plane of a flexible display device according to another exemplary embodiment of the present invention.
Figure 8:
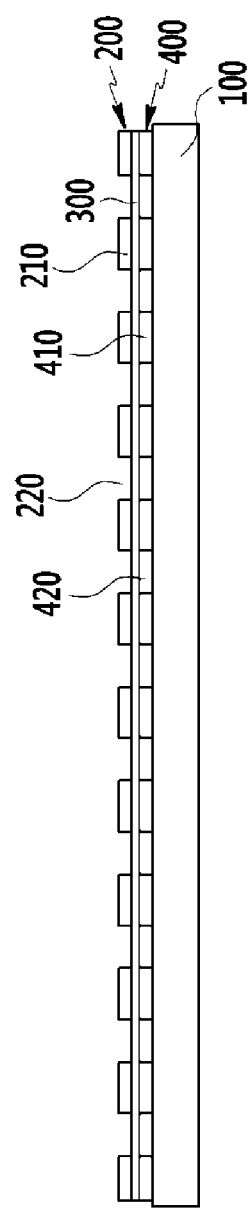
FIG. 8 is a diagram illustrating a side of the flexible display device illustrated in FIG. 7.

FIG. 7 is a diagram illustrating a plane of a flexible display device according to another exemplary embodiment of the present invention and FIG. 8 is a diagram illustrating a side of the flexible display device illustrated in FIG. 7.

Referring to FIGS. 7 and 8, the flexible display device 1000 according to the exemplary embodiment of the present invention includes a flexible display panel 100 which displays an image, a first electrode layer 200 disposed on the upper portion of the flexible display panel 100, a dielectric elastomer film 300, and a second electrode layer 400.

The flexible display panel 100 includes a display area DA which displays an image and peripheral areas PA which are disposed around the display area DA. Herein, the structure of the flexible display panel 100 is the same as the structure of the flexible display panel of the flexible display device illustrated in FIG. 1 and therefore the description thereof will be omitted.

The first electrode layer 200, the dielectric elastomer film 300, and the second electrode layer 400 are each disposed at the peripheral areas PA which are disposed at both sides of the display area DA of the flexible display panel 100.

The dielectric elastomer film 300 is made of dielectric elastomer. The dielectric elastomer is a material having characteristics in which a thickness is reduced and an area is increased when being applied with a voltage. Herein, the dielectric elastomer is a non-compressible material and may include, for example, at least one of silicon, fluoro elastic polymer, and isoprene.

The first electrode layer 200 is disposed on an upper portion of the dielectric elastomer film 300 and the second electrode layer 400 is disposed on a lower portion of the dielectric elastomer film 300. The second electrode layer 400 is disposed between the flexible display panel 100 and the dielectric elastomer film 300.

The first electrode layer 200 includes a plurality of first electrodes 210 and the second electrode layer 400 includes a plurality of second electrodes 410.

The first electrode 210 and the second electrode 410 may be made of one of carbon nanotubes, aluminum (Al), and molybdenum (Mo). Further, the first electrode 210 and the second electrode 410 may be made of a flexible electrode such as graphite and/or conductive polymer.

The plurality of first electrodes 210 are disposed to be spaced apart from each other as much as a first interval 220 and the plurality of second electrodes 410 are disposed to be spaced apart from each other as much as a second interval 420. The first electrode 210 and the second electrode 410 are disposed to overlap each other, having the dielectric elastomer film 300 therebetween.

Next, the bending of the flexible display device illustrated in FIG. 7 will be described with reference to FIG. 9.

FIG. 9 is a diagram illustrating a case in which a voltage is applied to both the first electrode and the second electrode in the flexible display device illustrated in FIG. 7.

FIG. 9 illustrates the case in which all the first electrodes 210 forming the first electrode layer 200 and all the second electrodes 410 forming the second electrode layer 400 are applied with a voltage.

When all the first electrodes 210 and all the second electrodes 410 are applied with a voltage, the dielectric elastomer film 300 between the first electrode 210 and the second electrode 410 is tensioned, such that the flexible display panel 100 is bent overall.

Herein, since the first electrode layer 200, the dielectric elastomer film 300, and the second electrode layer 400 are disposed on the upper portion of the flexible display panel 100, both ends of the flexible display panel 100 are bent toward the bottom from the top.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device, comprising:
a flexible display panel configured to display an image;
a dielectric elastomer film disposed on a portion of the flexible display panel;
a first electrode layer disposed on an upper portion of the dielectric elastomer film; and
a second electrode layer disposed on a lower portion of the dielectric elastomer film,
wherein:
the first electrode layer comprises a plurality of first electrodes, and each of the plurality of first electrodes is disposed apart from each other;
the second electrode layer comprises a plurality of second electrodes, the plurality of second electrodes being disposed apart from each other such that each second electrode entirely overlaps a corresponding one of the first electrodes; and
an area of the dielectric elastomer film is increased when the first electrode and the second electrode are applied with a voltage.

2. The flexible display device of claim 1, wherein the dielectric elastomer film comprises at least one of silicon, a fluoro elastic polymer, and isoprene.

3. The flexible display device of claim 2, wherein the first electrode and the second electrode comprise at least one of carbon nanotubes, aluminum, molybdenum, graphite, and conductive polymer.

4. The flexible display device of claim 3, wherein the dielectric elastomer film is disposed on the lower portion of the flexible display panel.

5. The flexible display device of claim 4, wherein the first electrode layer is disposed between the flexible display panel and the dielectric elastomer film.

6. The flexible display device of claim 5, wherein the plurality of first electrodes and the plurality of second electrodes are disposed in a matrix.

7. The flexible display device of claim 6, wherein all first electrodes of the plurality of first electrodes are configured to receive the same voltage, and all second electrodes of the plurality of second electrodes are configured to receive the same voltage.

8. The flexible display device of claim 6, wherein a first portion of the first electrodes is configured to receive a different voltage than a second portion of the first electrodes, wherein a first portion of the second electrodes is configured to receive a different voltage than a second portion of the second electrodes.

9. The flexible display device of claim 3, wherein the dielectric elastomer film is disposed on the upper portion of the flexible display panel.

10. The flexible display device of claim 9, wherein the second electrode layer is disposed between the flexible display panel and the dielectric elastomer film.

11. The flexible display device of claim 10, wherein the flexible display panel comprises a display area configured to display an image and peripheral areas disposed outside the display area.

12. The flexible display device of claim 11, wherein the dielectric elastomer film is disposed in at least one of the peripheral areas.

13. The flexible display device of claim 12, wherein the dielectric elastomer film is disposed in peripheral areas parallel to one another on opposite sides of the display area.

14. The flexible display device of claim 1, wherein the first electrodes and the second electrodes comprise a rectangular shape.

* * * * *